(12) United States Patent
Guibert

(10) Patent No.: US 7,790,333 B2
(45) Date of Patent: Sep. 7, 2010

(54) MICROLITHOGRAPHY METHOD USING A MASK WITH CURVED SURFACE

(75) Inventor: Jean-Charles Guibert, Saint Etienne de Crossey (FR)

(73) Assignee: Commissariat a l'Energie Atomique, Paris (FR)

(*) Notice: Subject to any disclaimer, the term of this patent is extended or adjusted under 35 U.S.C. 154(b) by 845 days.

(21) Appl. No.: 10/572,353

(22) PCT Filed: Sep. 15, 2004

(86) PCT No.: PCT/FR2004/050433

§ 371 (c)(1), (2), (4) Date: Jan. 5, 2007

(87) PCT Pub. No.: WO2005/026838

PCT Pub. Date: Mar. 24, 2005

(65) Prior Publication Data

US 2007/0092805 A1  Apr. 26, 2007

(30) Foreign Application Priority Data

Sep. 17, 2003  (FR) .................................. 03 50561

(51) Int. Cl.
G03F 1/00 (2006.01)
G03F 7/00 (2006.01)
B29C 35/08 (2006.01)
A01J 21/00 (2006.01)

(52) U.S. Cl. ............................ 430/5; 430/296; 264/496; 425/385

(58) Field of Classification Search ................ 430/5
See application file for complete search history.

(56) References Cited

U.S. PATENT DOCUMENTS

| 5,281,511 | A | 1/1994 | Gerhardt |
| 6,375,870 | B1 | 4/2002 | Visovsky et al. |
| 6,416,908 | B1 | 7/2002 | Klosner et al. |
| 2003/0054601 | A1* | 3/2003 | Yuki et al. .................. 438/200 |
| 2003/0104287 | A1 | 6/2003 | Yuasa |

(Continued)

FOREIGN PATENT DOCUMENTS

DE        199 13 683        11/1999

(Continued)

OTHER PUBLICATIONS

Ruchhoeft, P. et al., "Patterning curved surfaces: Template generation by ion beam proximity lithography and relief transfer by step and flash imprint lithography", Journal of Vacuum Science and Technology, vol. 17, No. 6, pp. 2965-2969, 1999.

(Continued)

*Primary Examiner*—Mark F Huff
*Assistant Examiner*—Jonathan Jelsma
(74) *Attorney, Agent, or Firm*—Oblon, Spivak, McClelland, Maier & Neustadt, L.L.P.

(57) ABSTRACT

A process for preparing a lithographic mask, including: making patterns on a plane mask, the plane mask having an SOI structure including a layer of semiconductor material, a buried layer of insulant and a substrate; and transferring the patterns and the mask to a curved support that includes at least one point of non-nil curvature.

13 Claims, 4 Drawing Sheets

U.S. PATENT DOCUMENTS

2005/0202322 A1* 9/2005 Furukawa et al. .............. 430/5

FOREIGN PATENT DOCUMENTS

EP 0 845 710 6/1998

OTHER PUBLICATIONS

Rogers, J.A. et al., "Printing, molding, and near-field photolithographic methods for patterning organic lasers, smart pixels and simple circuits", Synthetic Metals, vol. 115, No. 1-3, pp. 5-11, 2000.

Roos, Nils et al., "Nanoimprint Lithography with a Commercial 4 Inch Bond System for Hot Embossing", Proceedings of The SPIE, vol. 4343, pp. 427-435, 2001.

Chou, Stephen Y. et al., "Imprint of sub-25 nm Vias and trenches in polymers", Appl. Phys. Lett. vol. 67, No. 21, pp. 3114-3116, Nov. 20, 1995.

Tan, Hua et al., "Roller nanoimprint lithography", J. Vac. Sci. Technol. vol. 16, No. 6, pp. 3926-3928, 1998.

Guibert, Jean-Charles, "Nanotechnologies and nanolithography in Europe", pp. xxi-xxx.

* cited by examiner

MICROLITHOGRAPHY METHOD USING A MASK WITH CURVED SURFACE

TECHNICAL FIELD AND PRIOR ART

The invention relates to lithographic techniques that allow small size patterns to be reproduced on a substrate. The size of the patterns involved in this invention is for example below 10 microns.

The invention, given the size of the patterns employed, applies in particular to the micro- and nanotechnology fields. Different industrial applications can be targeted, for example the manufacture of flat screens, storage memories, nanosystems, microsystems or biochips.

Different lithographic techniques are known and used today in the industry. Most require the use of very costly equipment of the deep ultraviolet wafer stepper type at the 248, 193 or 157 nanomete wavelength or of electron beam machines. This equipment can cost anything from about ten up to several tens of millions of euros.

Some low-cost technologies are beginning to emerge, and they use embossing, inking or imprinting techniques known in the printing trade or plastic material shaping. Reference may be made for example to the article by S. Y. Chou et al., Applied Physics Letters, 67 (21), P 3114-3116, 1995.

However these techniques have limited results because of problems relating to resolution and the homogeneity thereof. Indeed, when a mask carrying the patterns to be reproduced has been manufactured by litho-etching, the substrate and the mask need to be brought into contact as perfectly as possible; this stage, difficult on surfaces of the order of a few $cm^2$, is practically impossible for surfaces larger than a few tens of $cm^2$. Indeed two surfaces plane overall but whose surfaces are not however identical need to be aligned and superposed, then brought into contact homogenously. The result is defective homogeneity in the resolution obtained. Different publications have highlighted this type of problem for example in the different articles of the "Proceedings of the International Workshop on nanoimprint lithography, 16-17 Jan. 2002, University of Lund, Sweden" and also in the article by N. Roos et al., entitled "Nanoimprint lithography with a commercial 4 inch bond system for hot embossing", SPIE 2001 Emerging Technologies and in the article entitled "Roller nanoimprint lithography" T. Hua et al., JVST B 16 (6) (1998) 3926-3928 or in the article by H. Y. Chou et al., already quoted above.

The problem is therefore posed of finding a new process, preferably one that is more straightforward to implement, and that allows the aforementioned problems to be resolved.

The problem is also posed of finding a process that is compatible with a plane structure such as an SOI structure.

DISCLOSURE OF THE INVENTION

The invention relates firstly to a process for preparing a lithographic mask, comprising:
- a stage for making patterns on a substrate or a plane mask,
- a stage for transferring the patterns to a curved support or one that has locally either on at least one point or one area of its surface at least one non-nil curvature.

The area with the non-nil curvature has for example a surface area of at least 0.5 or 1 $cm^2$, or of about a $cm^2$, for example between 0.5 $cm^2$ and 10 $cm^2$.

The invention proposes a process for making a mask, the surface of which is not plane since an initially plane mask has been transferred to a support that is at least locally curved. Different forms of support with a non-nil curvature may be appropriate, for example the outer surface of a cylinder.

After the transfer, it is possible to bring the surface of a substrate into contact with the surface of the mask, in a gradual and controlled way.

The homogeneity problem encountered therefore no longer arises since it comes down to a situation of bringing into contact two surfaces of a few $cm^2$.

Additionally the invention makes it possible to avoid embodying a mask directly on a curved surface, an embodiment difficult to implement.

The plane mask can for example be of silicon or silicon dioxide.

It may also have an SOI structure, comprising a layer of semiconductor material, a buried layer of insulant and a substrate. In the latter case, a stage of thinning the substrate of the SOI structure may additionally be provided.

The transfer stage may previously comprise a thinning of the plane substrate then the installation of a handle substrate.

As regards the curved support, this can be of metal, or glass or plastic material.

Means can be provided in the curved support to achieve a local deformation of this support.

The invention also relates to a lithographic mask that comprises a support with a non-nil curvature on at least one point of its surface, and a silicon or silicon substrate comprising a plurality of patterns applied against this surface.

DETAILED DISCLOSURE OF EMBODIMENTS OF THE INVENTION

The invention first of all implements a first stage for making patterns on a plane mask.

A lithographic technique can be used, for example by electron beam.

Figure 1:
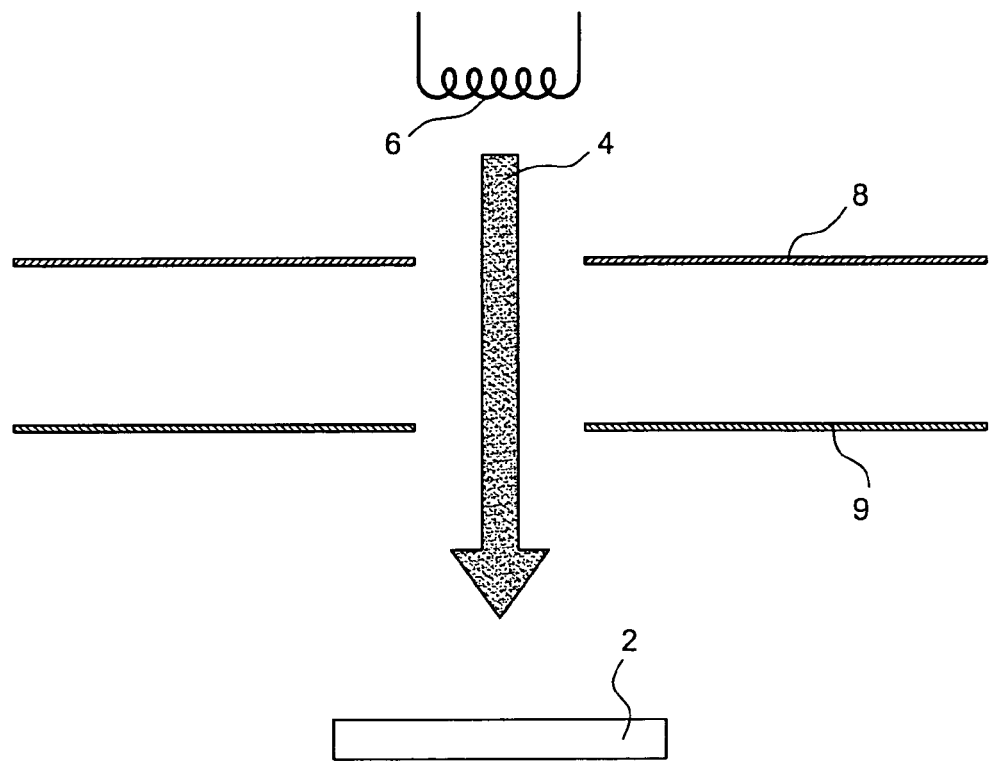
FIG. 1 shows diagrammatically an electron beam lithographic stage.

FIG. 1 shows diagrammatically a mask 2 on which patterns are to be written using just such an electron beam 4 of a lithographic device.

The beam is produced by a source 6, such as a filament of W, or LaB6 or by thermal field effect (TFE), is directed and focused, using electromagnetic lenses 8, 9, towards the mask 2.

The lithographic equipment is for example contact lithography equipment fitted with means for displacing and/or rotating the substrate or mask 2.

Figure 2:
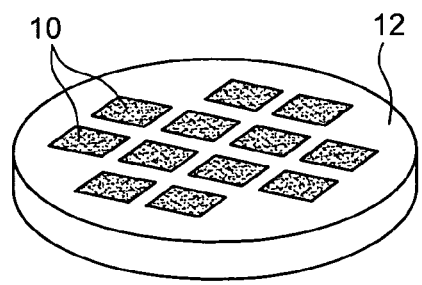
FIG. 2 shows the plane mask, after lithography.

This first stage makes it possible to obtain etched patterns 10 on a substrate 12, as shown in FIG. 2. The width L of each pattern may be less than 10 µm, for example between 10 nm and 100 nm (particularly with a view to making microdots in flat screens) or between 100 nm and 5 µm. For an application in the field of magnetic memories L will be between 10 nm and 20 nm. For an application in the field of transistors L may for example be between 1 µm and 10 µm.

The next stage is the transfer of these patterns to a curved support or one with at least one non-nil curvature on at least one point or one area of its surface or over all its surface or over an area comparable or approximately equal in size to that of the etched patterns.

Figure 3A:
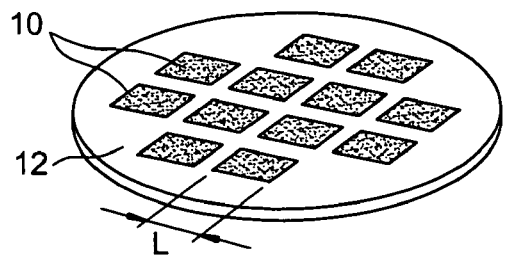
FIGS. 3A to 3C show different transfer stages.
Figure 3B:
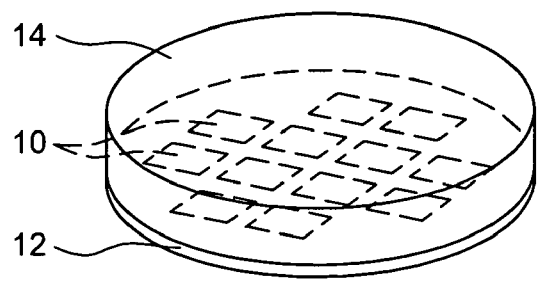
Figure 3C:
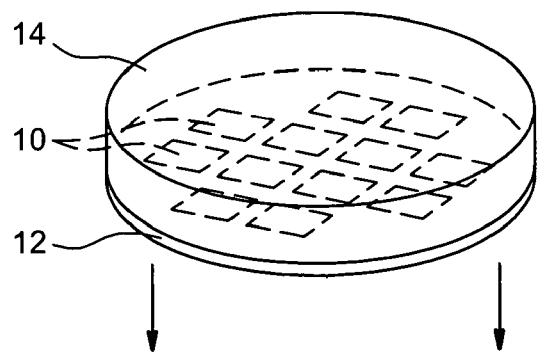

To this end, there may be a prior stage of thinning the substrate 12 (FIG. 3A), installing a so-called "handle" substrate 14 (FIG. 3B), then of transferring the whole thing to a support 16 that has a curvature of this kind (FIG. 3C). According to the example in FIG. 3C, the support 16 has a cylindrical portion, seen in cross-section in this figure.

Figure 4:
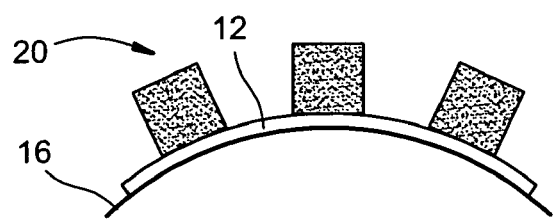
FIG. 4 shows a detail of a mask on its curved support surface, after transfer.

A curved mask 20 is thus obtained a detail of which is shown in FIG. 4.

The embodiment example given therefore makes it possible to manufacture a curved mask using two technologies, lithography and layer transfer.

Making small patterns directly onto a "curved" mask surface is difficult to achieve; in particular, in an electron masker for lithography, these difficulties are related to problems of depth of field: the electron beam does not retain the same dimension as you move over its length.

According to the example above, the litho-etching stage is therefore initially carried out on a plane mask in the usual electron beam lithography material, for example silicon or silicon oxide then the imaged layer is separated and transferred to a support that is at least locally curved.

Figure 5A:
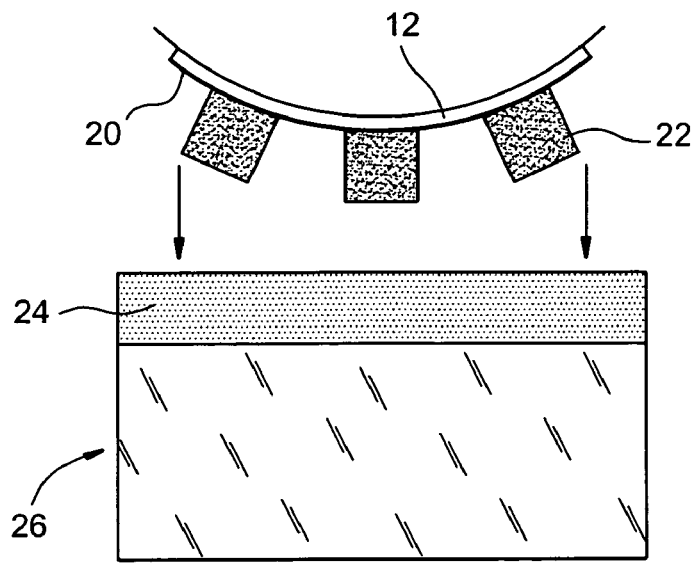
FIGS. 5A to 5C show a marking of a substrate using a mask according to the invention.
Figure 5B:
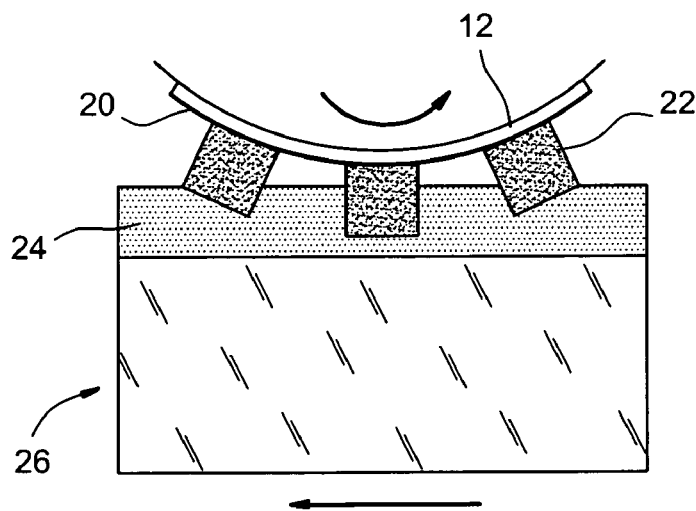
Figure 5C:
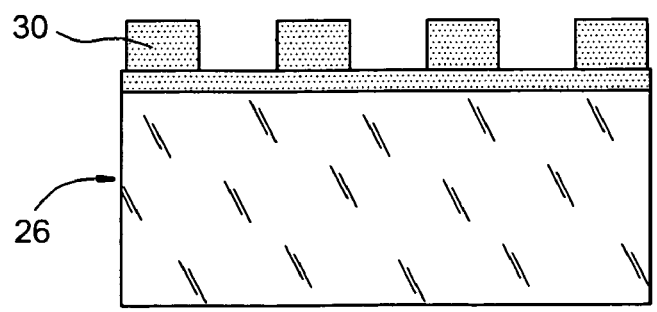

FIGS. 5A to 5C show the use of such a mask.

The curved mask 20, whose patterns are denoted overall by the reference 22, is brought into contact with the surface layer 24 (e.g.: of polymer resin) of a substrate 26 (e.g. of silicon or silicon dioxide).

Then (FIG. 5B), the next stage is the rotation of the mask and/or the displacement of the substrate 26.

The surfaces in contact, of the mask and the substrate respectively, have a surface of about a $cm^2$, for example between 0.5 $cm^2$ and 10 $cm^2$.

The result of this (FIG. 5C), after the mask 20 is removed, is a substrate 26 that carries an image 30 on the surface.

The material of the mask 2 is preferably adapted to the transfer in other words it has a chemical inactivity towards the substrate 26, and sufficient flexibility in the thickness used to be transferred to a curved surface. Silicon, or silica are materials that have this type of property, as does nitride.

But preferably, a substrate of the SOI type is used, with the etching being achieved in the surface layer of silicon.

SOI structures usually allow the embodiment of some semiconductor materials. Structures of this kind are for example described in document FR 2681472.

Figure 6:
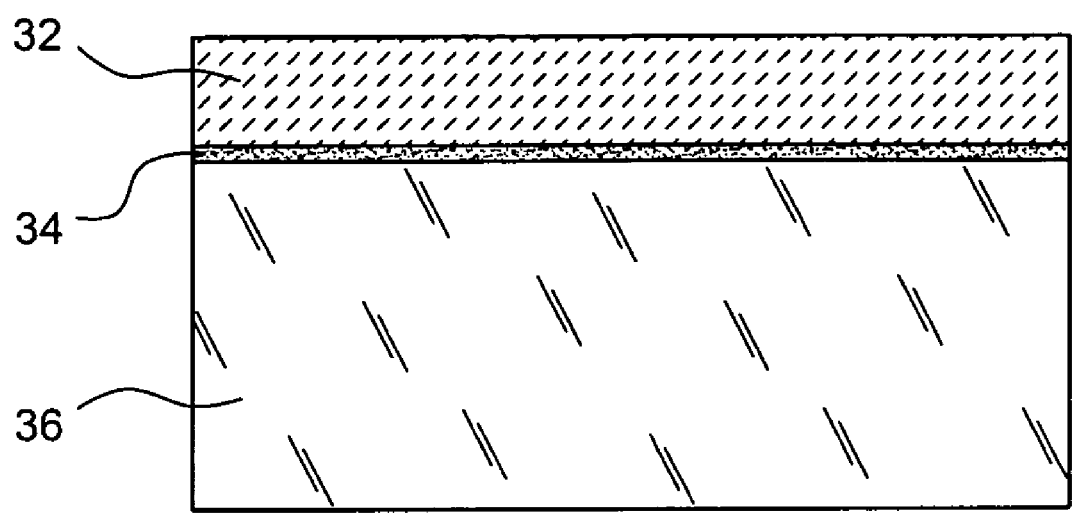
FIG. 6 shows an SOI structure.

As shown in FIG. 6, an SOI structure comprises a layer 32 of semiconductor material, for example monocrystalline silicon, in which the components themselves can be made, and under which is found a buried layer 34 of insulant, for example silicon dioxide. The whole thing rests on the substrate 36, itself also of a semiconductor material, for example silicon.

Typically, the surface layer 32 has a example of thickness of about 10 to 1000 nm (it can also be greater than 1 µm), whereas the layer 34 has a thickness of about a few hundreds of nanometes, for example 400 nm.

The curved support 16 of the mask can be made of different materials selected for their property of rigidity (all metal or glass) or again for their ease of shaping. A plastic support (e.g. polypropylene, or PVC, etc), can also be used, the deformation of this type of material allowing better contact between mask and substrate.

On the other hand, micro-system devices (for example an electrostatic piezoelectric actuator), can be fixed inside the curved support to allow a local deformation of the support, and therefore better placement of the patterns to be reproduced.

By way of example, a Leica VB6HR electron masker is used to write 50 nm patterns onto a wafer of silicon on insulant (SOI) of 200 mm diameter. After the lithographic stage, the upper layer of silicon, of a thickness of 100 nm, is separated from the substrate using a method described in the document FR-02 03909, which employs ion implantation then fracture, and the use of a handle. Then it is transferred onto a curved glass support. This support is for example a cylinder with a diameter at least equal to 200/3.14=64 mm.

The stage of transferring the image by imprint may be applied at a temperature of between 20° C. and 250° C., by exerting pressure of between 300 and 4,800 psi, and for a roller speed of between 0.5 and 1.5 cm/minute.

The invention allows a stage to be implemented for the homogeneous lithography of submicronic patterns with low-cost equipment, thanks to the use of a curved mask.

Examples of stages for transferring elements from one support to another support (allowing a bond separable system to be created) and for the bond separation of two elements (allowing a release to be implemented) are described in FR-2 781 925 and FR-2 796 491 respectively and can be used as part of the invention, particularly in the examples given above.

The invention claimed is:

1. A process for preparing a lithographic mask, comprising:
   making patterns on a plane mask, the plane mask having an SOI structure, comprising a layer of semiconductor material, a buried layer of insulant and a substrate; and
   transferring the patterns and the plane mask to a curved support that includes at least one point of non-nil curvature.

2. The process according to claim 1, wherein the making includes utilizing electron beam lithography to make the patterns.

3. The process according to claim 1 or 2, further comprising thinning the substrate of the SOI structure.

4. The process according to claim 1 or 2, further comprising:
   thinning the plane mask and installing a handle substrate before implementing the transferring.

5. The process according to claim 1 or 2, wherein the curved support includes metal, or glass or plastic material.

6. The process according to claim 1 or 2, further comprising:
   deforming the curved support with the non-nil curvature while transferring the patterns and the plane mask to the curved support.

7. The process according to claim 1 or 2, wherein the making includes making the patterns with a dimension of between 50 nm and 10 µm.

8. The process according to claim 1, wherein the transferring comprises:
   affixing the plane mask to the curved support such that a surface of the plane mask that includes the patterns faces away from the curved support.

9. The process according to claim 1, further comprising:
   disposing the curved support, with the patterns transferred thereto, to contact another substrate; and causing the curved support, with the patterns transferred thereto, to rotate and transfer an image to the another substrate.

10. The process according to claim 1, further comprising: deforming, with an actuator, the curved support with the non-nil curvature while transferring the patterns and the plane mask to the curved support.

11. The process according to claim 10, wherein the actuator is disposed within the curved surface.

12. The process according to claim 1, wherein the making patterns includes forming the patterns only in a surface layer of the SOI structure.

13. The process according to claim 12, further comprising: separating the surface layer of the SOI structure from the substrate prior to the transferring.

* * * * *